United States Patent
Horisaki

(10) Patent No.: US 7,633,416 B2
(45) Date of Patent: Dec. 15, 2009

(54) SEMICONDUCTOR INTEGRATED CIRCUIT CAPABLE OF SCREENING CONFORMING DIGITAL-ANALOG CONVERTERS AND ANALOG-DIGITAL CONVERTERS TO BE MOUNTED BY AUTO-CORRELATION ARITHMETIC OPERATION

(75) Inventor: Koji Horisaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/056,976

(22) Filed: Mar. 27, 2008

(65) Prior Publication Data

US 2008/0238741 A1    Oct. 2, 2008

(30) Foreign Application Priority Data

Mar. 29, 2007    (JP)    ............... 2007-087862

(51) Int. Cl.
   *H03M 1/10*    (2006.01)
(52) U.S. Cl. ........................ 341/120; 341/155
(58) Field of Classification Search ................ 341/120, 341/121, 144, 155
   See application file for complete search history.

(56) References Cited

U.S. PATENT DOCUMENTS

| 4,419,656 | A | * | 12/1983 | Sloane ........................ 341/120 |
|---|---|---|---|---|
| 4,580,126 | A | | 4/1986 | Kato et al. |
| 6,476,742 | B2 | | 11/2002 | Yamaguchi |
| 6,667,702 | B2 | * | 12/2003 | Sasaki et al. ................ 341/120 |
| 7,107,175 | B2 | * | 9/2006 | Maloberti et al. ........... 702/126 |
| 7,129,879 | B1 | * | 10/2006 | Glibbery ..................... 341/155 |

FOREIGN PATENT DOCUMENTS

| JP | 63-169123 | 7/1988 |
|---|---|---|
| JP | 2004-48383 | 2/2004 |

* cited by examiner

*Primary Examiner*—Brian Young
(74) *Attorney, Agent, or Firm*—Oblon, Spivak, McClelland, Maier & Neustadt, L.L.P.

(57) ABSTRACT

A semiconductor integrated circuit includes a test signal generating section which generates a test signal at the time of a test, a digital-analog converter which converts the test signal into an analog signal, an analog-digital converter which fetches a signal output from the digital-analog converter and converts the fetched signal into a digital signal, and an operating section which performs an auto-correlation arithmetic operation of a signal output from the analog-digital converter. The semiconductor integrated circuit further includes an evaluating section which evaluates presence/absence of distortion of the digital-analog converter and the analog-digital converter based on consistency of an auto-correlation arithmetic operation result in the operating section and a predetermined reference signal.

17 Claims, 5 Drawing Sheets

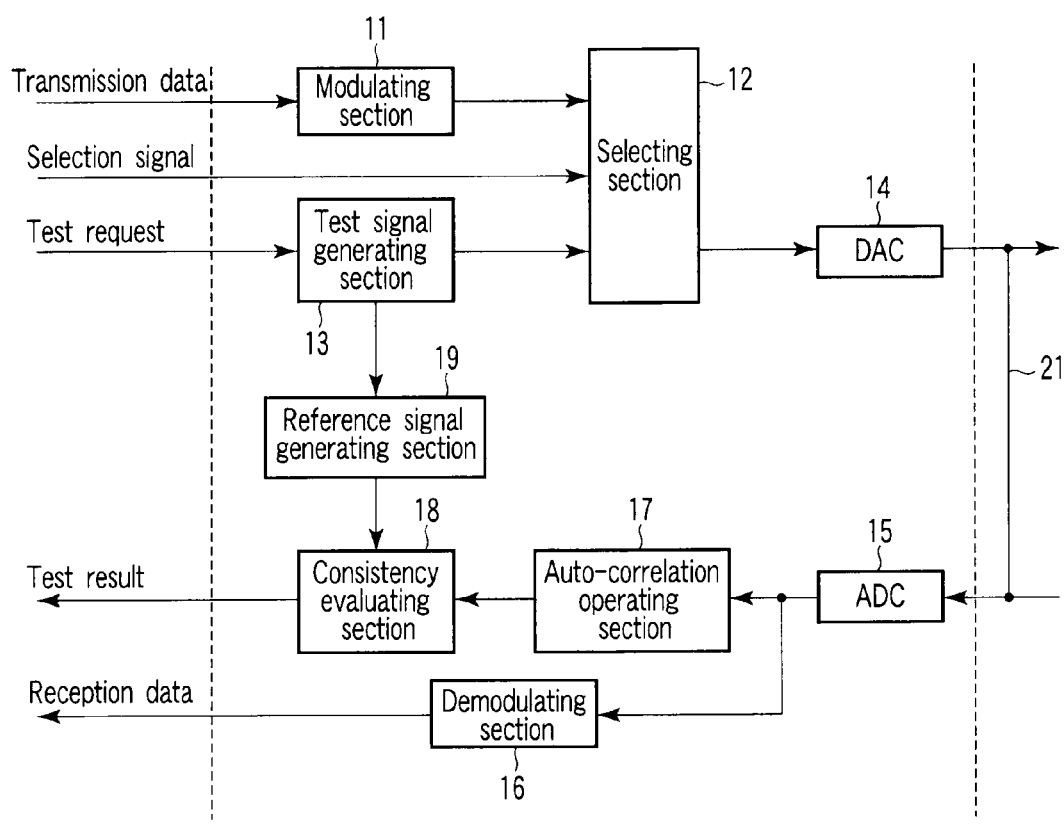
F I G. 1

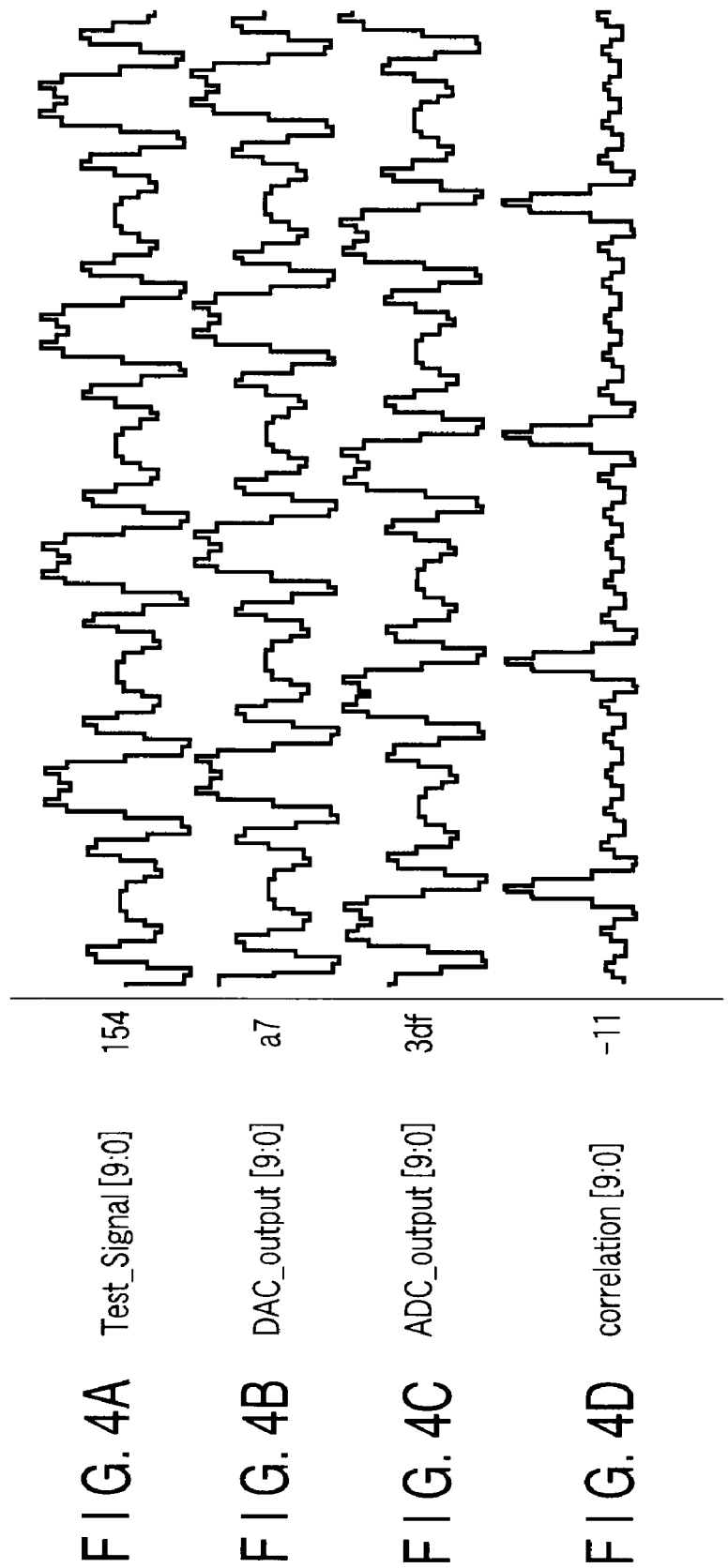
FIG. 4A  Test_Signal [9:0]   154
FIG. 4B  DAC_output [9:0]    a7
FIG. 4C  ADC_output [9:0]    3df
FIG. 4D  correlation [9:0]   −11

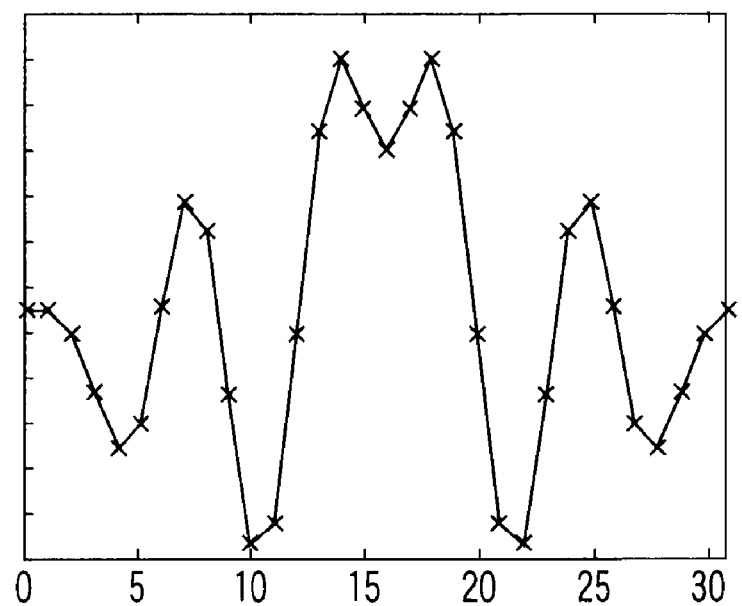
F I G. 5A
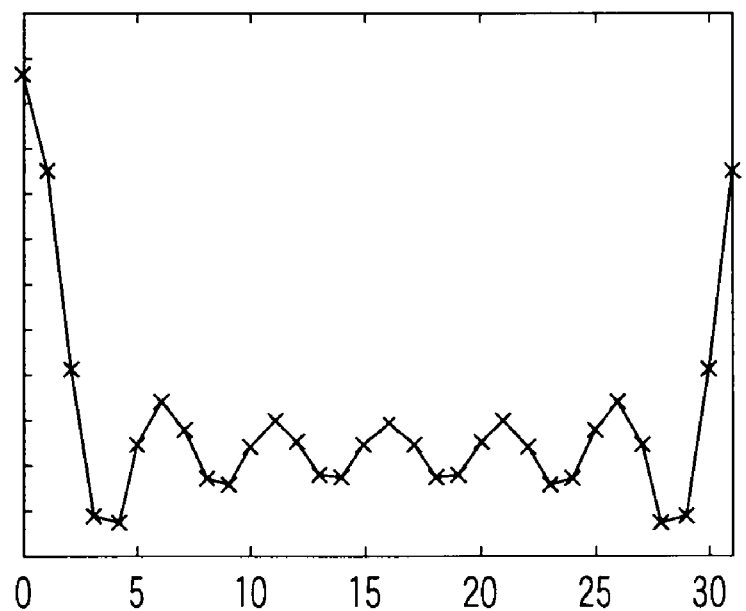
F I G. 5B

US 7,633,416 B2

SEMICONDUCTOR INTEGRATED CIRCUIT CAPABLE OF SCREENING CONFORMING DIGITAL-ANALOG CONVERTERS AND ANALOG-DIGITAL CONVERTERS TO BE MOUNTED BY AUTO-CORRELATION ARITHMETIC OPERATION

CROSS-REFERENCE TO RELATED APPLICATIONS

This application is based upon and claims the benefit of priority from prior Japanese Patent Application No. 2007-087862, filed Mar. 29, 2007, the entire contents of which are incorporated herein by reference.

BACKGROUND OF THE INVENTION

1. Field of the Invention

The present invention relates to a semiconductor integrated circuit. More particularly, the present invention relates to a semiconductor integrated circuit suitable for use in a wireless communication baseband (BB)-LSI (Large Scale Integrated circuit) on which a DAC (digital-analog converter) and an ADC (analog-digital converter) having substantially the same accuracy are mounted.

2. Description of the Related Art

At present, in a BB-LSI conforming to a standard "802.11a" for wireless LAN (Local Area Network) communication determined by the Institute of Electrical & Electronics Engineers (which will be referred to as IEEE hereinafter), an LSI tester is used to screen fair-quality DACs and ADCS. That is, the LSI tester is used to generate a test signal for screening conforming items and analyze a response signal with respect to this test signal. Therefore, there is a problem of a cost.

To reduce the cost, it is desirable for the BB-LSI itself to generate a test signal and analyze a response signal. For example, there can be considered a method of supplying an internally generated test signal to a DAC, allowing an output from the DAC to pass through (loop back) an ADC, and analyzing a response signal obtained from this output by using a matched filter. However, in this method (using the matched filter to analyze the response signal), a result of the analysis fluctuates according to the passage delay amount of a loop back signal. There is a therefore a drawback that adjustment is required at the time of configuring a screening environment in order to compensate this fluctuation.

Further, utilizing a built-in FFT (Fast Fourier Transform) included in the BB-LSI to analyze the response signal can be also considered (see, e.g., Jpn. Pat. Appln. KOKAI Publication No. 2004-048383). However, since the FFT is specialized for OFDM (Orthogonal Frequency Division Multiplexing) transmission/reception, its accuracy is insufficient for analysis of the response signal. Furthermore, since it is used for both transmission and reception, complicated control is required, and diverting it for a loop back operation is not easy.

BRIEF SUMMARY OF THE INVENTION

According to a first aspect of the present invention, there is provided a semiconductor integrated circuit comprising: a test signal generating section which generates a test signal; a digital-analog converter which converts the test signal into an analog signal; an analog-digital converter which fetches a signal output from the digital-analog converter and converts the signal into a digital signal; an operating section which performs an auto-correlation arithmetic operation of a signal output from the analog-digital converter; and an evaluating section which evaluates presence/absence of distortion of the digital-analog converter and the analog-digital converter based on consistency of an auto-correlation arithmetic operation result in the operating section and a predetermined reference signal.

According to a second aspect of the present invention, there is provided a semiconductor integrated circuit comprising: a test signal generating section which generates a test signal; a digital-analog converter which converts the test signal into an analog signal; an analog-digital converter which fetches a signal output from the digital-analog converter and converts the signal into a digital signal; an operating section which performs an auto-correlation arithmetic operation of a signal output from the analog-digital converter; and an evaluating section which evaluates presence/absence of distortion of the digital-analog converter and the analog-digital converter based on orthogonality of an auto-correlation arithmetic operation result in the operating section and a predetermined reference signal.

BRIEF DESCRIPTION OF THE SEVERAL VIEWS OF THE DRAWING

FIG. 1 is a block diagram showing a structural example of a transmitting/receiving section in a semiconductor integrated circuit (a BB-LSI) according to a first embodiment of the present invention;

FIGS. 4A to 4D are signal waveform diagrams for explaining an operation of screening conforming DAC and ADC mounted on the BB-LSI depicted in FIG. 3; and FIGS. 5A and 5B are signal waveform diagrams each showing a specific example of a test signal (a reference signal) and an auto-correlation arithmetic operation result according to other embodiments of the present invention.

DETAILED DESCRIPTION OF THE INVENTION

Figure 2:
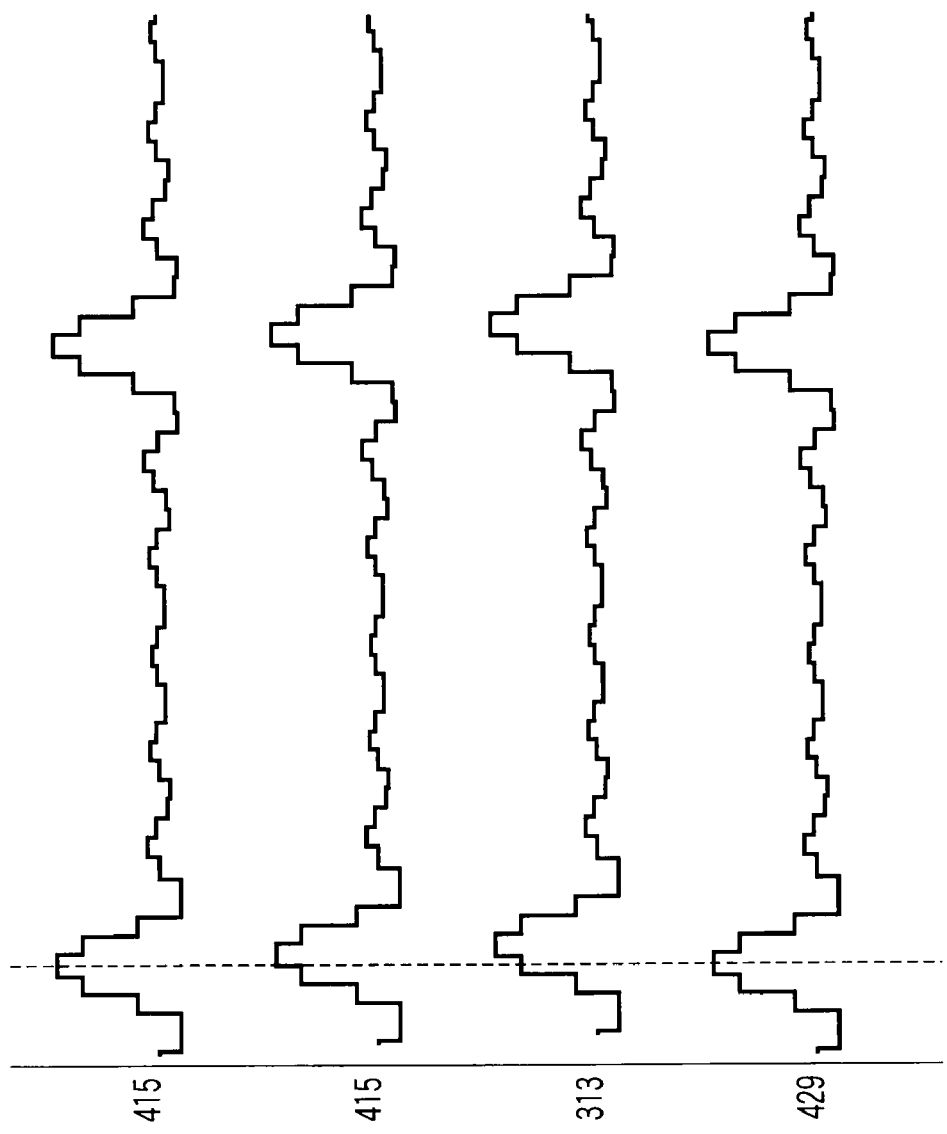
FIGS. 2A to 2D are signal waveform diagrams for explaining an operation of screening conforming DAC and ADC mounted on the BB-LSI depicted in FIG. 1.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

FIG. 1 shows a structural example (a primary part) of a semiconductor integrated circuit according to a first embodiment of the present invention. It is to be noted that a BB-LSI based on the standard "802.11a" for wireless LAN communication determined by IEEE will be taken as an example and an explanation will be given as to an operation of screening conforming DAC and ADC mounted on a transmitting/receiving section in the BB-LSI.

In FIG. 1, a modulating section 11 modulates transmission data that is transmitted from a BB-LSI, and outputs this data to a selecting section 12. A test signal generating section 13 generates a predetermined test signal and outputs this generated signal to the selecting section 12 in accordance with a test start request supplied from, e.g., a control section (not shown) in the BB-LSI. Here, the test signal generated by the test signal generating section 13 at the time of a test is a digital signal which is used to screen conforming DAC and ADC and has a fixed cycle T.

The selecting section 12 selects one of an output from the modulating section 11 and an output from the test signal generating section 13 to be output to a D/A converter (DAC) 14 in accordance with a selection signal supplied from, e.g., the control section in the BB-LSI. The D/A converter 14 converts the output from the modulating section 11 or the output from the test signal generating section 13 into an analog signal. At the time of a regular operation, modulated transmission data as the output from the modulating section 11 is selected by the selecting section 12, and this selected data is supplied to the D/A converter 14. Moreover, this D/A converter 14 outputs the output from the modulating 11 which has been converted into the analog signal (modulated analog transmission data) to the outside of the BB-LSI.

On the other hand, at the time of a test, a test signal as the output from the test signal generating section 13 is selected by the selecting section 12, and this selected signal is supplied to the D/A converter 14. The test signal is converted into an analog signal by the D/A converter 14, and then temporarily output to the outside of the BB-LSI. Additionally, this output signal (an analog test signal) is input to an A/D converter (ADC) 15 through a wire connection 21 provided outside the BB-LSI. The wire connection 21 connects an output terminal of the D/A converter 14 with an input terminal of the A/D converter 15 at the time of a test alone.

The A/D converter 15 converts a reception signal (the analog signal) received by the BB-LSI into a digital signal. Further, the A/D converter 15 also converts the analog test signal from the D/A converter 14 into a digital signal serving as a loop back signal. This A/D converter 15 has substantially the same accuracy (ability) as that of the D/A converter 14. The A/D converter 15 outputs the digitized reception signal to a demodulating section 16 at the time of the regular operation, and outputs the digitized test signal to an auto-correlation operating section 17 at the time of the test, respectively. The demodulating section 16 demodulates the digital reception signal as the output from the A/D converter 15, and fetches it as reception data into the BB-LSI.

The auto-correlation operating section 17 executes an auto-correlation arithmetic operation with respect to the output signal from the A/D converter 15, and calculates an auto-correlation function $F(\tau)=\int f(t) \cdot f(t+\tau)dt$ with respect to a digital test signal f(t). In this embodiment, an integral interval and a range of $\tau$ for calculation of the auto-correlation function $F(\tau)$ are equalized to the cycle T of the test signal generated by the test signal generating section 13. That is, the auto-correlation operating section 17 obtains a response signal having substantially the same amplitude as that of a waveform of the test signal irrespective of a phase of the response signal in order to compensate a passage delay amount (a phase of the response signal) of the test signal in, e.g., the D/A converter 14 and the A/D converter 15, and thereby enables analysis of the response signal which is not dependent on the passage delay amount of the test signal in a later-explained consistency evaluating section 18. An arithmetic operation result (the auto-correlation function) $F\tau$) from this auto-correlation operating section 17 is supplied to the consistency evaluating section 18.

The consistency evaluating section 18 analyzes the response signal, e.g., evaluates presence/absence of distortion of the D/A converter 14 and the A/D converter 15 based on consistency of the arithmetic operation result $F(\tau)$ from the auto-correlation operating section 17 and a reference signal from a reference signal generating section 19. The reference signal generating section 19 generates the reference signal from the test signal fed from the test signal generating section 13, and produces the reference signal having substantially the same amplitude as that of a waveform of the test signal in this embodiment.

Here, the reference signal is determined as an expected value E(t) of an auto-correlation arithmetic operation result based on the ideal operation of the D/A converter 14 and the A/D converter 15, and an evaluation function in the consistency evaluating section 18 is defined as $G(t)=\{F(\tau)-E(t)\}^2$. As a result, the consistency evaluating section 18 calculates $V=\int G(t)dt$ (where an integral interval is the same as the cycle T of the test signal) as an evaluation result, and outputs this calculated value as a test result. In this case, if the value of the evaluation result V is "0", this means that the response signal matches with the reference signal, namely, the D/A converter 14 and the A/D converter 15 are conforming items having no distortion. That is, the obtained evaluation result V represents a square error caused due to distortion of the D/A converter 14 and the A/D converter 15, and this evaluation result V is not dependent on the passage delay amount from the output of the test signal generating section 13 to the input of the auto-correlation operating section 17.

Incidentally, in regard to Fs(t) representing a sign of the auto-correlation arithmetic operation result $F(\tau)$ (+1 in the case of a positive value and –1 in the case of a negative value) and Es(t) representing a sign of the expected value E(t), an evaluation function of the consistency evaluating section 18 is defined as $Gs(t)=Fs(t) \cdot Es(t)$. Based on this definition, the consistency evaluating section 18 may calculate $Vs=\int Gs(t)dt$ (where an integral interval is the same as the cycle T of the test signal) as an evaluation result and output this calculated value as a test result. In this example, the response signal matches with the reference signal when a value of the evaluation result Vs is high.

A description will now be given as to an operation of screening conforming DAC and ADC mounted on the BB-LSI having the above-explained structure. First, at the time of the test, the output terminal of the D/A converter 14 is connected with the input terminal of the A/D converter 15 through the wire connection 21 outside the BB-LSI. Then, the test signal generating section 13 generates such a test signal as depicted in FIG. 2A in response to a test start request supplied from, e.g., the control section in the BB-LSI. This test signal is supplied to the D/A converter 14 via the selecting section 12. Further, this signal is subjected to D/A conversion, thereby obtaining such an analog test signal as depicted in FIG. 2B.

The analog test signal from the D/A converter 14 is supplied to the A/D converter 15 via the wire connection 21. Furthermore, this signal is subjected to A/D conversion, thereby obtaining such a digital test signal f(t) as depicted in FIG. 2C. This digital test signal f(t) is supplied to the auto-correlation operating section 17 where an auto-correlation function $F(\tau)$ is calculated. As a result, such an arithmetic operation result $F(\tau)$ as depicted in FIG. 2D is obtained.

The consistency evaluating section 18 evaluates consistency of this arithmetic operation result $F(\tau)$ with respect to a reference signal from the reference signal generating section 19. In this embodiment, consistency with respect to the reference signal which is an expected value E(t) of the auto-correlation arithmetic result and has substantially the same amplitude as, e.g., a waveform of the test signal depicted in FIG. 2A. As a result, an evaluation result V which is not dependent on a phase of a response signal can be obtained. A test result as the evaluation result V is fetched into the BB-LSI and utilized to screen the conforming D/A converter 14 and A/D converter 15.

As explained above, in the BB-LSI on which the D/A converter and the A/D converter are mounted, the BB-LSI itself generates the test signal and obtains the auto-correlation function of the loop back signal that has sequentially passed through the D/A converter and the A/D converter, thereby analyzing the response signal. That is, the auto-correlation arithmetic operation result $F(\tau)$ with respect to the response signal is compared with the expected value E(t) of the auto-correlation arithmetic operation, and the conforming D/A converter and A/D converter mounted on the BB-LSI are screened. As a result, in analysis of the response signal, the evaluation result V that is not dependent on a phase of the response signal (a passage delay amount of the test signal) can be obtained. Therefore, performances (presence/absence of distortion) of the D/A converter and the A/D converter can be readily evaluated without using, e.g., a costly LSI tester. Therefore, the conforming DAC and ADC mounted on the BB-LSI can be efficiently screened.

In particular, a highly accurate FFT can be used to provide a configuration enabling an equivalent evaluation result, but this embodiment has a merit of reducing a circuit scale as compared with an example where the highly accurate FFT is used.

It is to be noted that, when the test signal matching with the auto-correlation function can be also used as the reference signal, the reference signal generating section can be eliminated or simplified (a circuit scale of the reference signal generating section can be reduced).

Second Embodiment

Figure 3:
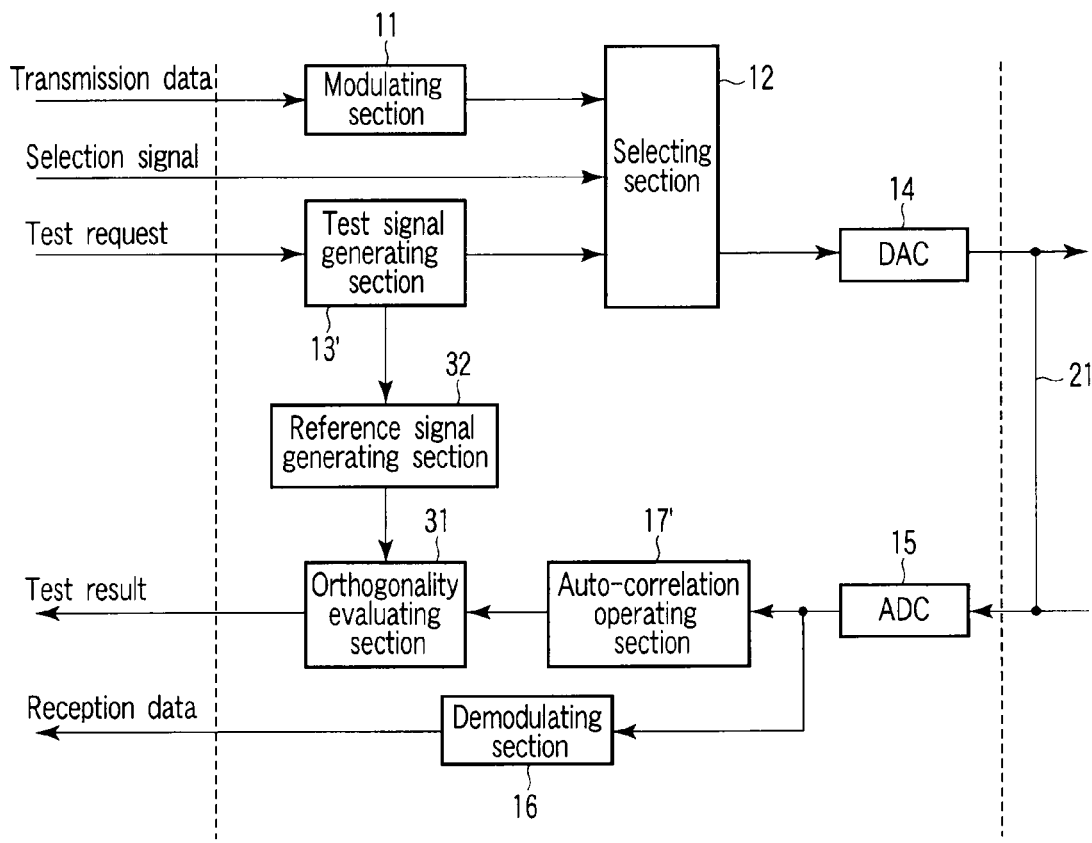
FIG. 3 is a block diagram showing a structural example of a transmitting/receiving section in a semiconductor integrated circuit (BB-LSI) according to a second embodiment of the present invention.

FIG. 3 shows a structural example (a primary part) of a semiconductor integrated circuit according to a second embodiment of the present invention. In this embodiment, a BB-LSI based on the standard "802.11a" for wireless LAN communication determined by IEEE will be taken as an example. In this embodiment, a description will be given as to an example where conforming DAC and ADC mounted on a transmitting/receiving section in the BB-LSI are screened based on orthogonality of an auto-correlation arithmetic operation result with respect to a response signal (a loop back signal) and an expected value thereof. It is to be noted that like reference numerals denote parts equal to those in FIG. 1, thereby omitting a detailed explanation thereof.

In FIG. 3, a modulating section 11 modulates transmission data which is transmitted from a BB-LSI, and outputs the modulated data to a selecting section 12. A test signal generating section 13' generates a predetermined test signal to be output to the selecting section 12 in accordance with a test start request supplied from, e.g., a control section (not shown) in the BB-LSI. Here, the test signal generated in the test signal generating section 13' at the time of a test is a digital signal having a fixed cycle T used to screen conforming DAC and ADC. Further, in this embodiment, the test signal generating section 13' generates a test signal with which comparison (a product sum) between a result of an auto-correlation arithmetic operation with respect to a loop back signal and its expected value results in "0". It is to be noted that the expected value is a signal that is orthogonal to a result of the auto-correlation arithmetic operation based on ideal operation of the DAC and the ADC, and which is generated based on the test signal.

The selecting section 12 selects one of an output from the modulating section 11 and an output from the test signal generating section 13' to be output to a D/A converter (DAC) 14 in accordance with a selection signal supplied from, e.g., the control section in the BB-LSI. At the time of a regular operation, the selecting section 12 selects modulated transmission data as the output from the modulating section 11 and outputs the selected data to the D/A converter 14. Moreover, this D/A converter 14 outputs the output (modulated analog transmission data) of the modulating section 11 which has been converted into an analog signal to the outside of the BB-LSI.

On the other hand, at the time of a test, the selecting section 12 selects a test signal as the output from the test signal generating section 13' to be supplied to the D/A converter 14. The test signal is converted into an analog signal by the D/A converter 14 and then temporarily output to the outside of the BB-LSI. Additionally, this output signal (an analog test signal) is input to an A/D converter (ADC) 15 via a wire connection 21 provided outside the BB-LSI. The wire connection 21 connects an output terminal of the D/A converter 14 with an input terminal of the A/D converter 15 at the time of a test alone.

The A/D converter 15 converts a reception signal (an analog signal) received by the BB-LSI into a digital signal. Further, at the time of a test, the A/D converter 15 converts the analog test signal fed from the D/A converter 14 into a digital signal serving as a loop back signal. This A/D converter 15 has substantially the same accuracy (ability) as that of the D/A converter 14. The A/D converter 15 outputs the digitized reception signal to a demodulating section 16 at the time of the regular operation, and outputs the digitized test signal to an auto-correlation operating section 17' at the time of the test, respectively. The demodulating section 16 demodulates the digital reception signal as the output from the A/D converter 15, and fetches it into the BB-LSI as reception data.

The auto-correlation operating section 17' executes an auto-correlation arithmetic operation with respect to the output signal from the A/D converter 15, and calculates an auto-correlation function $F(\tau)=\int f(t) \cdot f(t+\tau)dt$ with respect to a digital test signal f(t). In this embodiment, an integral interval and a range of $\tau$ for calculation of the auto-correlation function $F(\tau)$ are equalized to the cycle T of the test signal generated by the test signal generating section 13'. That is, the auto-correlation operating section 17' obtains a response signal having an amplitude orthogonal to a waveform of the test signal irrespective of a phase of the response signal in order to compensate a passage delay amount (the phase of the response signal) and an amplitude of the test signal in, e.g., the D/A converter 14 and the A/D converter 15, and thereby enables analysis of the response signal that is not dependent on the passage delay amount, a gain, and an attenuation of the test signal in a later-explained orthogonality evaluating section 31. An arithmetic operation result (the auto-correlation function) $F(\tau)$ of this auto-correlation operating section 17' is supplied to the orthogonality evaluating section 31.

The orthogonality evaluating section 31 analyzes the response signal, e.g., evaluates presence/absence of distortion in the D/A converter 14 and the A/D converter 15 based on orthogonality of the arithmetic operation result $F(\tau)$ in the auto-correlation operating section 17' and a reference signal from the reference signal generating section 32. The reference signal generating section 32 generates the reference signal based on the test signal from the test signal generating section 13', and produces a reference signal having substantially the same amplitude as a waveform of the test signal in this embodiment.

Here, the reference signal is a signal (an expected value) O(t) orthogonal to an auto-correlation arithmetic operation result based on the ideal operation of the D/A converter 14 and the A/D converter 15, and an evaluation function of the orthogonality evaluating section 31 is defined as $I(t)=F(\tau)\cdot O(t)$. As a result, the orthogonality evaluating section 31 calculates $W=\int I(t)dt$ (where an integral interval is the same as the cycle T of the test signal) as an evaluation result, and outputs this evaluation result as a test result. In this case, if the D/A converter 14 and the A/D converter 15 are conforming units without distortion, a value of the evaluation result W is "0" without being dependent on a passage delay amount, a gain, and an attenuation from the output of the test signal generating section 13' to the input of the auto-correlation operating section 17'.

An operation of screening the conforming DAC and ADC mounted on the thus configured BB-LSI will now be explained. First, at the time of a test, the output terminal of the D/A converter 14 is connected with the input terminal of the A/D converter 15 through the wire connection 21 outside the BB-LSI. Then, the test signal generating section 13' generates such a test signal as depicted in FIG. 4A in accordance with a test start request supplied from, e.g., the control section in the BB-LSI. This test signal is supplied to the D/A converter 14 through the selecting section 12. Further, this signal is subjected to D/A conversion, thereby obtaining such an analog test signal as shown in FIG. 4B.

The analog test signal from the D/A converter 14 is supplied to the A/D converter 15 via the wire connection 21. Furthermore, this signal is subjected to A/D conversion, thereby obtaining such a digital test signal f(t) as shown in FIG. 4C. This digital test signal f(t) is supplied to the auto-correlation operating section 17' to calculate an auto-correlation function $F(\tau)$. As a result, such an arithmetic operation result $F(\tau)$ as depicted in FIG. 4D can be obtained.

The orthogonality evaluating section 31 evaluates orthogonality of this auto-correlation result $F(\tau)$ with respect to the reference signal from the reference signal generating section 32. In this embodiment, the orthogonality evaluating section 31 evaluates the orthogonality with respect to the reference signal which is the expected value O(t) of the auto-correlation arithmetic operation result and has substantially the same amplitude as, e.g., a waveform of the test signal depicted in FIG. 4A. As a result an evaluation result W which is not dependent on a phase and an amplitude of a response signal can be obtained. The test result as the evaluation result W is fetched into the BB-LSI to be utilized for screening the conforming D/A converter 14 and the A/D converter 15.

As explained above, evaluating the orthogonality of the auto-correlation function $F(\tau)$ of the loop back signal with respect to the expected value O(t) likewise dependent on the phase (the passage delay amount of the test signal) and the amplitude of the response signal. That is, presence/absence of distortion of the D/A converter and the A/D converter can be evaluated, and the conforming DAC and ADC mounted on the BB-LSI can be thereby efficiently screened at a low cost.

It is to be noted that this embodiment also has a merit of reducing a circuit scale as compared with an example using a highly accurate FFT to enable obtaining an equivalent evaluation result.

Moreover, when the test signal orthogonal to the auto-correlation function is also used as the reference signal like the second embodiment, the reference signal generating section can be eliminated or simplified (a circuit scale of the reference signal generating section can be reduced).

Any Other Embodiment

FIG. 5A shows an example where a signal having a preamble (standard) waveform is used as a test signal in a BB-LSI. This test signal is a signal formed with, e.g., a discrete value of 32 samplings every 40 MHz and has 800 nm as one cycle, and continuously and repeatedly supplied from a test signal generating section. Additionally, a waveform of this signal is obtained by combining respective frequency components of 1.25 MHz, 2.5 MHz, 3.75 MHz, 5 MHz, 6.25 MHz, and 7.5 MHz with an equal gain by using an appropriate phase.

FIG. 5B shows a waveform representing an arithmetic operation result $F(\tau)$ in an auto-correlation operating section when the signal having the waveform depicted in FIG. 5A is used as a test signal, and this waveform has an orthogonal relationship with the waveform of the test signal.

For example, in the BB-LSI depicted in FIG. 3, when the test signal generating section 13' generates a test signal having the waveform depicted in FIG. 5A, this test signal is equal to a signal O(t) orthogonal to the auto-correlation arithmetic operation result $F(\tau)$. Therefore, the orthogonality evaluating section 31 can directly utilize the test signal from the test signal generating section 13' as a reference signal. As a result, the reference signal generating section 32 is not longer necessary, and the circuit scale can be further reduced.

Furthermore, when using the test signal having the waveform depicted in FIG. 5A, tests for a plurality of frequency components can be simultaneously executed, which is particularly useful.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
    a test signal generating section which generates a test signal that is a signal matching with an auto-correlation function and that has a fixed cycle;
    a digital-analog converter which converts the test signal into an analog signal;
    an analog-digital converter which fetches a signal output from the digital-analog converter and converts the signal into a digital signal;
    an operating section which performs an auto-correlation arithmetic operation of a signal output from the analog-digital converter; and
    an evaluating section which evaluates presence/absence of distortion of the digital-analog converter and the analog-digital converter based on consistency of an auto-correlation arithmetic operation result in the operating section and a predetermined reference signal.

2. The circuit according to claim 1, wherein the predetermined reference signal is an expected value of the auto-correlation arithmetic operation result based on ideal operation of the digital-analog converter and the analog-digital converter.

3. The circuit according to claim 1, further comprising a reference signal generating section which generates the predetermined reference signal based on the test signal.

4. The circuit according to claim 3, wherein the predetermined reference signal has the same amplitude as the test signal.

5. The circuit according to claim 1, wherein the digital-analog converter and the analog-digital converter are mounted on a wireless communication baseband LSI (Large Scale Integrated circuit), and
the digital-analog converter and the analog-digital converter have substantially the same accuracy.

6. The circuit according to claim 1, wherein an output terminal of the digital-analog converter is connected with an input terminal of the analog-digital converter through a wire connection at the time of a test.

7. The circuit according to claim 1, wherein the operating section sets an integral interval and a range of $\tau$ when calculating the auto-correlation function ($F(\tau)=\int f(t)\cdot f(t+\tau)dt$) with respect to the test signal (f(t)) to be equal to a cycle (T) of the test signal.

8. The circuit according to claim 1, wherein, when the predetermined reference signal is an expected value E(t) of the auto-correlation arithmetic operation result based on the ideal operation of the digital-analog converter and the analog-digital converter and an evaluation function is defined as $G(t)=\{F(\tau)-E(\tau)\}^2$, the evaluating section calculates $V=\int G(t)dt$.

9. The circuit according to claim 1, wherein, when the evaluation function is defined as $Gs(t)=Fs(t)\cdot Es(t)$ with respect to Fs(t) representing a sign of the auto-correlation arithmetic operation result ($F(\tau)$) (+1 in the case of a positive value, −1 in the case of a negative value) and Es(t) representing a sign of the expected value E(t) of the auto-correlation arithmetic operation result, the evaluating section calculates $Vs=\int Gs(t)dt$ as an evaluation result.

10. A semiconductor integrated circuit comprising:
a test signal generating section which generates a test signal that is a signal orthogonal to an auto-correlation function and that has a fixed cycle;
a digital-analog converter which converts the test signal into an analog signal;
an analog-digital converter which fetches a signal output from the digital-analog converter and converts the signal into a digital signal;
an operating section which performs an auto-correlation arithmetic operation of a signal output from the analog-digital converter; and
an evaluating section which evaluates presence/absence of distortion of the digital-analog converter and the analog-digital converter based on orthogonality of an auto-correlation arithmetic operation result in the operating section and a predetermined reference signal.

11. The circuit according to claim 10, wherein the predetermined signal is an expected value of the auto-correlation arithmetic operation result based on ideal operation of the digital-analog converter and the analog-digital converter.

12. The circuit according to claim 10, further comprising a reference signal generating section which generates the predetermined reference signal based on the test signal.

13. The circuit according to claim 12, wherein the predetermined reference signal has the same amplitude as the test signal.

14. The circuit according to claim 10, wherein the digital-analog converter and the analog-digital converter are mounted on a wireless communication baseband LSI (Large Scale Integrated circuit), and
the digital-analog converter and the analog-digital converter have substantially the same accuracy.

15. The circuit according to claim 10, wherein an output terminal of the digital-analog converter is connected with an input terminal of the analog-digital converter through a wire connection at the time of a test.

16. The circuit according to claim 10, wherein the operating section sets an integral interval and a range of $\tau$ when calculating the auto-correlation function ($F(\tau)=\int f(t)\cdot f(t+\tau)dt$) with respect to the test signal (f(t)) to be equal to a cycle (T) of the test signal.

17. The circuit according to claim 10, wherein, when the predetermined reference signal is an expected value O(t) orthogonal to the auto-correlation arithmetic operation result based on the ideal operation of the digital-analog converter and the analog-digital converter and an evaluation function is defined as $I(t)=F(\tau)\cdot O(t)$, the evaluating section calculates $W=\int I(t)dt$.

\* \* \* \* \*